United States Patent
Osawa

(10) Patent No.: US 8,248,158 B2
(45) Date of Patent: Aug. 21, 2012

(54) CHOPPER STABILIZED AMPLIFIER

(75) Inventor: Masato Osawa, Auderghem (BE)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 13/221,432

(22) Filed: Aug. 30, 2011

(65) Prior Publication Data

US 2012/0049950 A1   Mar. 1, 2012

(30) Foreign Application Priority Data

Sep. 1, 2010  (JP) ................................ P2010-195764

(51) Int. Cl.
*H03F 1/02* (2006.01)
(52) U.S. Cl. ................ 330/9; 330/10; 330/69; 327/124; 327/307
(58) Field of Classification Search ................ 330/9, 10, 330/69; 327/124, 307
See application file for complete search history.

(56) References Cited

U.S. PATENT DOCUMENTS

| | | | | |
|---|---|---|---|---|
| 3,471,687 | A * | 10/1969 | Pullen, Jr. | 330/9 |
| 4,191,929 | A * | 3/1980 | Max et al. | 330/10 |
| 6,259,313 | B1 * | 7/2001 | Lewicki | 327/563 |
| 6,462,612 | B1 * | 10/2002 | Roh et al. | 327/539 |
| 7,518,443 | B2 * | 4/2009 | Matthews | 330/10 |
| 7,538,705 | B2 * | 5/2009 | Deval et al. | 341/143 |
| 7,847,628 | B2 * | 12/2010 | Denison | 330/9 |

FOREIGN PATENT DOCUMENTS

JP   1986-089704 A   5/1986

* cited by examiner

*Primary Examiner* — Patricia Nguyen
(74) *Attorney, Agent, or Firm* — Westerman, Hattori, Daniels & Adrian, LLP

(57) ABSTRACT

A chopper stabilized amplifier may include a modulation circuit that performs a digital conversion on an input signal so as to convert the input signal into a first modulated signal by using a modulation signal, the modulation signal being a rectangular wave having a predetermined frequency, an operational amplifier circuit that amplifies the first modulated signal so as to convert the first modulated signal into a second modulated signal, and a demodulation circuit that performs analog conversion on the second modulated signal so as to convert the second modulated signal into an output signal by using a demodulation signal, the demodulation signal having a waveform that corresponds to the differences between frequency components of the first modulated signal and the second modulated signal.

9 Claims, 12 Drawing Sheets

CHOPPER STABILIZED AMPLIFIER

BACKGROUND OF THE INVENTION

1. Field of the Invention

The present invention relates to a chopper stabilized amplifier.

Priority is claimed on Japanese Patent Application No. 2010-195764, filed Sep. 1, 2010, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

Chopper stabilized amplifiers are widely used as low-noise, low-drift direct-current amplifiers (see, for example, Japanese Unexamined Patent Application, First Publication No. S61-89704). The structure of a conventional chopper stabilized amplifier will now be described using FIG. 10. FIG. 10 is a circuit diagram illustrating the structure of a conventional chopper stabilized amplifier. A chopper stabilized amplifier CHOP_AMP shown in FIG. 10 includes an input terminal INP, an input terminal INM, an operational amplifier circuit AMP, a modulation circuit MOD, a demodulation circuit DEMOD, a load capacitor CLM, a load capacitor CLP, an output terminal OUTP and an output terminal OUTM.

A signal VIN(t) that is input through the input terminal INP and the input terminal INM is input into the modulation circuit MOD. A modulation signal CK1 and a modulation signal nCK1 are input into the modulation circuit MOD from the outside, and the modulation circuit MOD modulates the signal VIN(t) using the modulation signal CK1 and the modulation signal nCK1, and then outputs this signal to an input terminal of the operational amplifier circuit AMP as a first modulated signal Vmod1.

The first modulated signal Vmod1 that is input into the operational amplifier circuit AMP is amplified by the operational amplifier circuit AMP so as to become a second modulated signal Vmod2 which is then output to the demodulation circuit DEMOD. The modulation signal CK1 and the modulation signal nCK1 are input into the demodulation circuit DEMOD from the outside, and the second modulated signal Vmod2 is demodulated by the modulation signal CK1 and the modulation signal nCK1, and is then output from the output terminal OUTM and the output terminal OUTP as an output signal OUT(t).

The load capacitor CLM is connected between an inverting output terminal of the operational amplifier circuit AMP and the ground, while the load capacitor CLP is connected between a non-inverting output terminal of the operational amplifier circuit AMP and the ground. These capacitors are parasitic capacitors, or else compensation capacitors that enable the amplifier to operate stably.

The modulation circuit MOD and the demodulation circuit DEMOD will now be described. The modulation circuit MOD includes a switch unit S1, a switch unit S2, a switch unit S3, and a switch unit S4. The switch unit S1 is interposed between the input terminal INP and a non-inverting input terminal of the operational amplifier circuit AMP, while the switch unit S2 is interposed between the input terminal INM and the inverting input terminal of the operational amplifier circuit AMP. The switch unit S3 is interposed between the input terminal INP and the inverting input terminal of the operational amplifier AMP, while the switch unit S4 is interposed between the input terminal INM and the non-inverting input terminal of the operational amplifier circuit AMP.

The modulation signal CK1 is supplied to the switch unit S1 and the switch unit S2, and the switch unit S1 and the switch unit S2 are switched on when the modulation signal CK1 is at a high level (hereinafter, indicated by "H"), and are switched off when the modulation signal CK1 is at a low level (hereinafter, indicated by "L"). The modulation signal nCK1 is supplied to the switch unit S3 and the switch unit S4. The switch unit S3 and the switch unit S4 are switched on when the modulation signal nCK1 is at "H", and are switched off when the modulation signal nCK1 is at "L".

The demodulation circuit DEMOD includes a switch unit S1', a switch unit S2', a switch unit S3', and a switch unit S4'. The switch unit S1' is interposed between the inverting output terminal of the operational amplifier circuit AMP and an output terminal OUTM, while the switch unit S2' is interposed between the non-inverting output terminal of the operational amplifier circuit AMP and an output terminal OUTP. The switch unit S3' is interposed between the inverting output terminal of the operational amplifier circuit AMP and the output terminal OUTP, while the switch unit S4' is interposed between the non-inverting input terminal of the operational amplifier circuit AMP and the output terminal OUTM.

The modulation signal CK1 is supplied to the switch unit S1' and the switch unit S2'. The switch unit S1' and the switch unit S2' are switched on when the modulation signal CK1 is at "H", and are switched off when the modulation signal CK1 is at "L". The modulation signal nCK1 is supplied to the switch unit S3' and the switch unit S4'. The switch unit S3' and the switch unit S4' are switched on when the modulation signal nCK1 is at "H", and are switched off when the modulation signal nCK1 is at "L".

A chopping operation (i.e., a modulation operation and a demodulation operation) of the conventional chopper stabilized amplifier CHOP_AMP will now be described with reference made to FIG. 10 and FIG. 11. FIG. 11 is a timing chart illustrating waveforms of the modulation signal CK1 and the modulation signal nCK1.

The modulation circuit MOD uses the four switches that are switched on and off by the modulation signal CK1 that has a rectangular waveform that changes periodically at a predetermined frequency, and by the modulation signal nCK1 that has a rectangular waveform and whose phase is offset by 180° from that of the modulation signal CK1 to control which of the output terminal OUTM and the output terminal OUTP the output signals output from the non-inverting output terminal and the inverting output terminal of the operational amplifier circuit AMP are input into.

Because the modulation signal CK1 is at "H" and the modulation signal nCK1 is at "L" from the timing t1 to the timing t2, the switch unit S1 and the switch unit S2 are switched to on, and the switch unit S3 and the switch unit S4 are switched to off. As a result of this, the input terminal INP is connected to the non-inverting input terminal of the operational amplifier circuit AMP, and the input terminal INM is connected to the inverting input terminal of the operational amplifier circuit AMP.

In contrast, because the modulation signal CK1 is at "L" and the modulation signal nCK1 is at "H" from the timing t2 to the timing t3, the switch unit S1 and the switch unit S2 are switched to off, and the switch unit S3 and the switch unit S4 are switched to on. As a result of this, the input terminal INP is connected to the inverting input terminal of the operational amplifier circuit AMP, and the input terminal INM is connected to the non-inverting input terminal of the operational amplifier circuit AMP.

Moreover, in the same way as the modulation circuit MOD, the demodulation circuit DEMOD uses the four switch units that are switched on and off by the modulation signal CK1 and by the modulation signal nCK1 to control which of the output terminal OUTM and the output terminal OUTP the output signals output from the non-inverting output terminal and the inverting output terminal of the operational amplifier circuit AMP are input into.

Because the modulation signal CK1 is at "H" and the modulation signal nCK1 is at "L" from the timing t1 to the timing t2, the switch unit S1' and the switch unit S2' are switched to on, and the switch unit S3' and the switch unit S4' are switched to off. As a result of this, the non-inverting output terminal of the operational amplifier circuit AMP is connected to the output terminal OUTP, and the inverting output terminal of the operational amplifier circuit AMP is connected to the output terminal OUTM.

In contrast, because the modulation signal CK1 is at "L" and the modulation signal nCK1 is at "H" from the timing t2 to the timing t3, the switch unit S1' and the switch unit S2' are switched to off, and the switch unit S3' and the switch unit S4' are switched to on. As a result of this, the inverting output terminal of the operational amplifier circuit AMP is connected to the output terminal OUTP, and the non-inverting output terminal of the operational amplifier circuit AMP is connected to the output terminal OUTM.

Next, using FIG. 12, a description of the input signal frequency characteristics and noise at the main nodes of the conventional chopper stabilized amplifier CHOP_AMP will be given. The graphs (a) through (f) in FIG. 12 show the signal amplitude—frequency characteristics of the respective main nodes. The vertical axes show amplitude, while the horizontal axes show frequency. The operational amplifier circuit AMP has the input referred noise Vn shown in the graph (c), and the modulation circuit MOD and the demodulation circuit DEMOD modulate input signals by making repeated switches using the modulation signal CK1 and the modulation signal nCK1 (i.e., a square wave having the frequency f).

Namely, when an input signal VIN(t) having the frequency characteristics shown in the graph (a) is input, the input signal is modulated by the modulation signal CK1 and the modulation signal nCK1 in a modulation circuit MOD, and changes to a first modulated signal Vmod1 that has the frequency characteristics shown in the graph (b). As a result of this, the input signal VIN(t) is modulated to a signal whose frequency is an odd multiple of the frequency of the modulation signal CK1 and the modulation signal nCK1 that control the chopper processing of the modulation circuit MOD.

Next, the input referred noise Vn shown in the graph (c) is added to the first modulated signal Vmod1 in the input terminal of the operational amplifier circuit AMP, and a second modulated signal Vmod2 which is amplified by the operational amplifier circuit AMP changes to a signal having the frequency characteristics shown in the graph (d). The demodulation circuit DEMOD demodulates the second modulated signal Vmod2 to the frequency band of the input signal (i.e., a low-frequency band which includes direct current) using the modulation signal CK1 and the modulation signal nCK1, and outputs an output signal OUT(t) having the frequency characteristics shown in the graph (e). At this time, the demodulation circuit DEMOD modulates the input referred noise Vn of the operational amplifier circuit AMP to a signal whose frequency is an odd multiple of the frequency of the modulation signal CK1 and the modulation signal nCK1 used for the demodulation.

Not only is the amplified input signal included in the output signal OUT(t) which is output finally from the demodulation circuit DEMOD, but components of the input referred noise Vn which is modulated to a signal whose frequency is an odd multiple of the frequency of the modulation signal CK1 and the modulation signal nCK1 are also included therein. Because of this, a low-pass filter (LPF) is provided on the output side, and the input referred noise Vn that has been modulated to a signal whose frequency is an odd multiple of the frequency of the modulation signal CK1 and the modulation signal nCK1 as well as the offset voltage component are removed by this low-pass filter, and an output signal LPOUT(t) having the frequency characteristics shown in the graph (f) can be obtained. Namely, the above described chopper stabilized amplifier suppresses the effects of the input referred noise of the operational amplifier circuit AMP, and is able to amplify only the frequency components of the input signal.

Here, a description will be given using FIG. 13 of the signal waveform in the main node of the conventional chopper stabilized amplifier CHOP_AMP. FIG. 13 is a timing chart illustrating the voltage signal at each node of the conventional chopper stabilized amplifier CHOP_AMP. In order to simplify the description, the voltages at each node shown in FIG. 13 are displayed with only one channel (for example, a system connected in the following sequence: the input terminal INP—the non-inverting input terminal of the operational amplifier circuit AMP—the non-inverting output terminal of the operational amplifier circuit AMP—the output terminal OUTP) of the operational amplifier circuit AMP, which is a fully differential amplifier, being used as representative thereof. The other channels may be thought of as channels in which the signal of the channel being displayed as a representative is vertically inverted. Moreover, in the present description, it is assumed that there are no limits on the frequency characteristics and slew rate of the operational amplifier circuit AMP. Note that in all of the timing charts shown in FIG. 13, the vertical axis shows the voltage while the horizontal axis shows the time.

The following description is given based on the sine wave shown in the graph (b) of FIG. 13 being input into the input terminal INP as the input signal VIN(t) in the chopper stabilized amplifier CHOP_AMP, and on a signal obtained by vertically inverting the sine wave shown in the graph (b) of FIG. 13 being input into the input terminal INM. In the modulation circuit MOD, the input signal VIN(t) shown in the graph (b) of FIG. 13 is modulated by the modulation signal CK1 and the modulation signal nCK1. However, the modulation signal CK1 has the shape shown in the graph (a) of FIG. 13. Moreover, although the modulation signal nCK1 changes in an inverse phase of the modulation signal CK1, this is not shown in the drawing.

Because the multiplication of the input signal VIN(t) and the modulation signal CK1 is performed in the modulation circuit MOD, the first modulated signal Vmod1 shown in the graph (c) of FIG. 13 is ultimately output, and this is input into the non-inverting input terminal of the operational amplifier circuit AMP. This signal is amplified by the operational amplifier circuit AMP and becomes the second modulated signal Vmod2. The second modulated signal Vmod2 is input into the demodulator circuit DEMOD, and is demodulated by the modulation signal CK1 (shown in the graph (e) of FIG. 13) and the modulation signal nCK1. The demodulated signal forms a sine wave such as that shown in the graph (f) of FIG. 13. The output signal LPOUT(t) that has passed through the low pass filter which is provided in order to remove input referred noise components which have been modulated to a signal whose frequency is an odd multiple of the frequency of the modulation signal CK1 and the modulation signal nCK1 has the shape shown in the graph (g) of FIG. 13.

In the above explanation, a description has been given of a case in which there are no limits on the frequency characteristics and slew rate of the operational amplifier circuit AMP. However, in actuality, the operational amplifier circuit AMP does have a limited slew rate and limited frequency characteristics. Furthermore, the load capacitor CLM and the load capacitor CLP that enable the amplifier to operate stably are present at the output terminals of the operational amplifier circuit AMP. Accordingly, in an actual operational amplifier circuit AMP, the amplification factor of the high frequency components of the first modulated signal Vmod1 ends up being lower than the amplification factor of the low frequency components of the first modulated signal Vmod1.

The voltage waveforms of the main nodes of a chopper stabilized amplifier in these circumstances are shown in the graphs (a') through (g') of FIG. 13. However, because the waveforms of the graphs (a) and (a'), the waveforms of the graphs (b) and (b'), the waveforms of the graphs (c) and (c'), and the waveforms of the graphs (e) and (e') are the same, descriptions of the graphs (a'), (b'), (c'), and (e') are omitted.

A description will now be given of the graphs (d'), (f), and (g') of FIG. 13. Because an actual operational amplifier circuit AMP has a limited slew rate and limited frequency characteristics, a slight deviation such as that shown in the graph (d') is generated in the waveform of the second modulated signal Vmod2 after it has been amplified. This modulated signal Vmod2 is input into the demodulation circuit DEMOD and is demodulated by the modulation signal CK1 and the modulation signal nCK1. Because there is no deviation the modulation signal CK1 and the modulation signal nCK1, glitching such as that shown in the graph (f) is generated in the output signal OUT(t) after it has been demodulated.

Because the glitching generated in the output signal OUT(t) cannot be completely removed by a low-pass filter, it has the drawback that harmonic distortion is generated in the output signal LPOUT(t) after it has passed through the low-pass filter. The graph (g') of FIG. 13 shows the waveform of the output signal LPOUT(t).

SUMMARY

The present invention provides a chopper stabilized amplifier that suppresses glitching that is generated because the operational amplifier circuit has limited frequency characteristics and a limited slew rate, and that makes it possible to obtain an output signal having less harmonic distortion.

A chopper stabilized amplifier may include: a modulation circuit that performs a digital conversion on an input signal so as to convert the input signal into a first modulated signal by using a modulation signal, the modulation signal being a rectangular wave having a predetermined frequency; an operational amplifier circuit that amplifies the first modulated signal so as to convert the first modulated signal into a second modulated signal; and a demodulation circuit that performs analog conversion on the second modulated signal so as to convert the second modulated signal into an output signal by using a demodulation signal, the demodulation signal having a waveform that corresponds to the differences between frequency components of the first modulated signal and the second modulated signal.

The chopper stabilized amplifier may further include: a modulation/demodulation signal generation unit that is connected to the modulation circuit and the demodulation circuit, the modulation/demodulation signal generation unit supplying the modulation signal to the modulation circuit, the modulation/demodulation signal generation unit supplying the demodulation signal generated based on the modulation signal to the demodulation circuit.

The modulation/demodulation signal generation unit may include: a modulation signal generation unit that outputs a rectangular wave as the modulation signal; and a low-pass filter that receives the rectangular waves so as to output as the demodulation signal a signal in which only high frequency components of the rectangular wave have been attenuated.

Cutoff frequency of the low-pass filter substantially may match cutoff frequency of the operational amplifier circuit.

The low-pass filter may include a resistor and a capacitor.

The low-pass filter may include a second operational amplifier circuit whose characteristics are the same as characteristics of the operational amplifier circuit.

The modulation/demodulation signal generation unit may include: a modulation signal generation unit that outputs a rectangular wave as the modulation signal; and a demodulation signal generation unit that outputs as the demodulation signal a signal in which only high frequency components of the rectangular wave have been attenuated.

The modulation signal generation unit may be a NOT circuit, and the demodulation signal generation unit may be a NOT circuit having a current setting function.

The modulation signal generation unit may be a NOT circuit, and the demodulation signal generation unit may be a NOT circuit having a larger load capacitor than the modulation signal generation unit.

According to the present invention, by performing analog conversion on the second modulated signal so as to convert it into an output signal using a demodulation signal having a waveform that corresponds to the differences between the frequency components of the first and second modulated signals, it is possible to suppress glitching that is generated because the operational amplifier circuit has limited frequency characteristics and a limited slew rate, and to obtain an output signal having less harmonic distortion.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will be now described herein with reference to illustrative preferred embodiments. Those skilled in the art will recognize that many alternative preferred embodiments can be accomplished using the teaching of the present invention and that the present invention is not limited to the preferred embodiments illustrated for explanatory purpose.

First Preferred Embodiment

Figure 1:
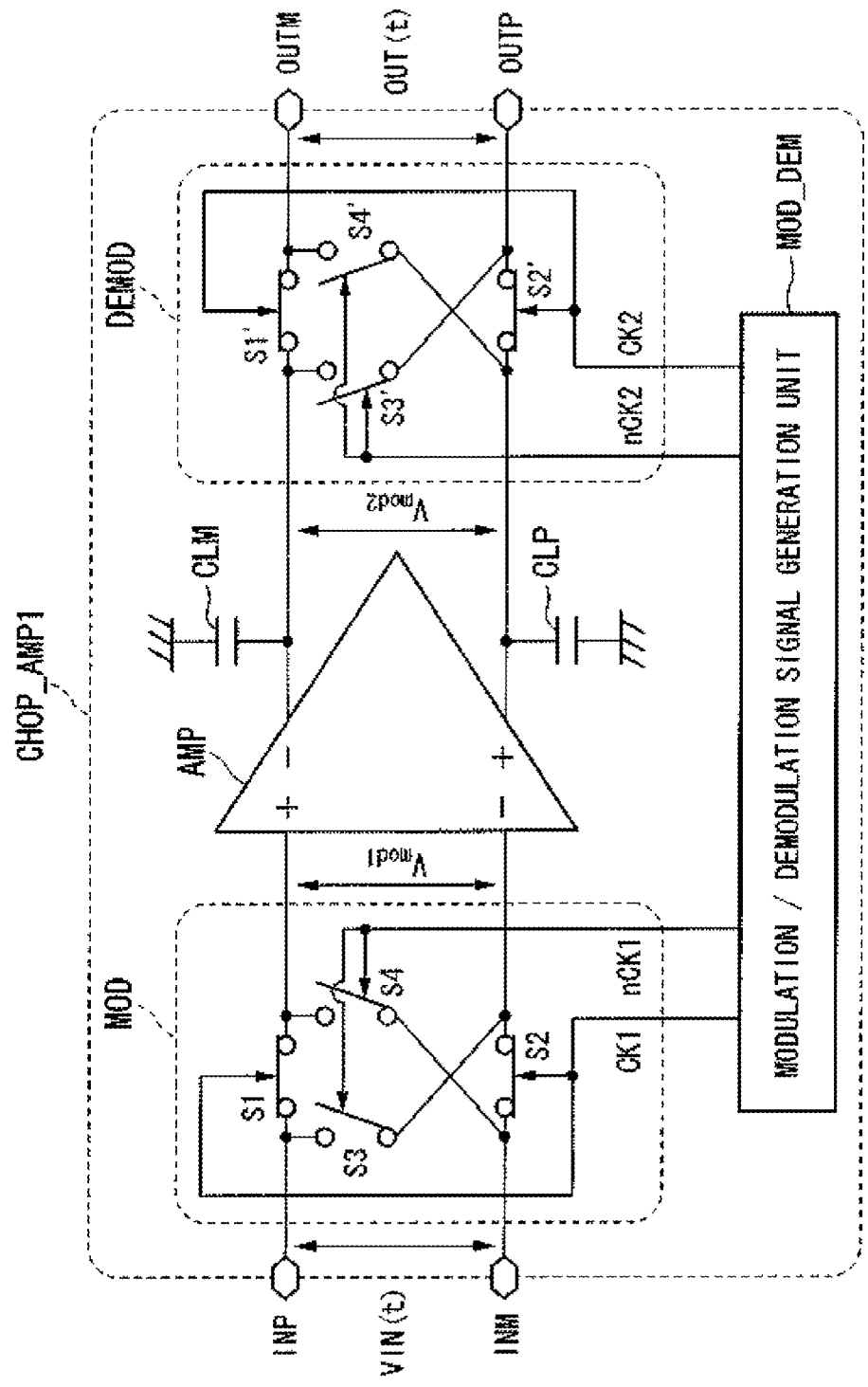
FIG. 1 is a circuit diagram illustrating a structure of a chopper stabilized amplifier in accordance with a first preferred embodiment of the present invention.
Figure 10:
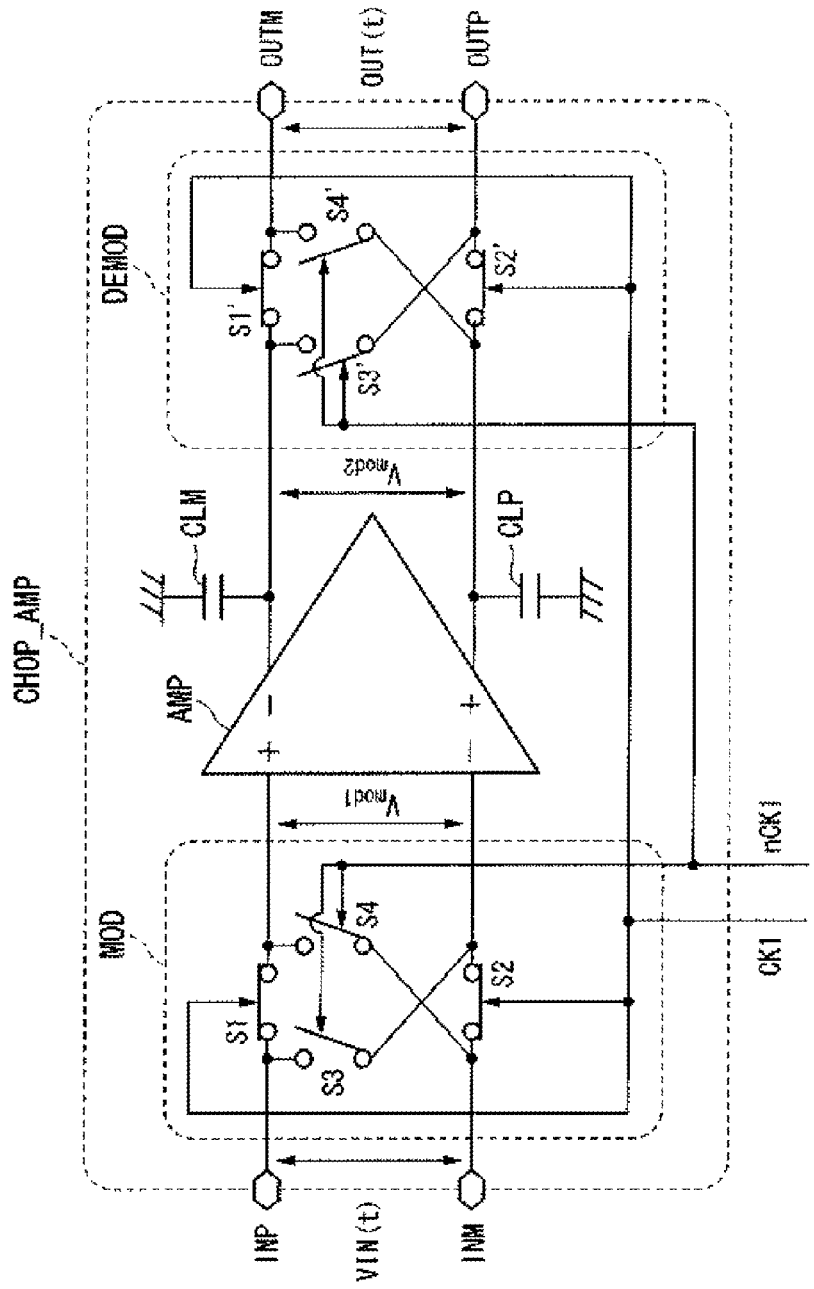
FIG. 10 is a circuit diagram illustrating a structure of a chopper stabilized amplifier in accordance with the related art.
Figure 11:
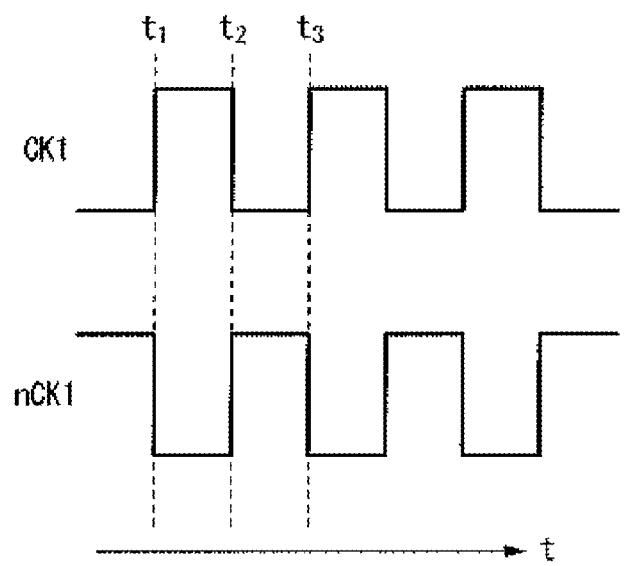
FIG. 11 is a timing chart illustrating waveforms of modulation signals of the chopper stabilized amplifier in accordance with the related art.
Figure 12:
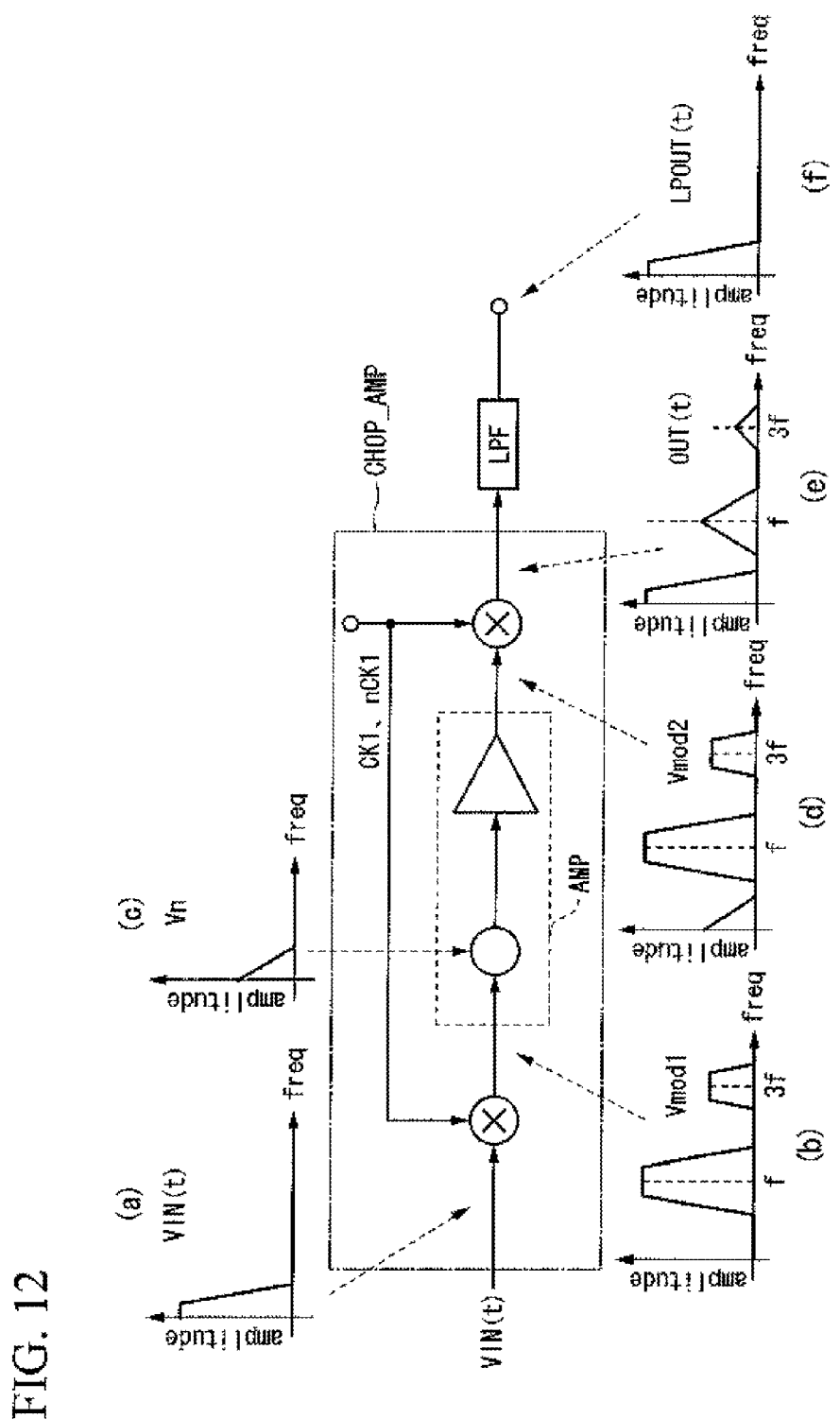
FIG. 12 is a view showing a noise and frequency characteristics of an input signal at each node of chopper stabilized amplifier in accordance with the related art.

Firstly, a first preferred embodiment of the present invention will be described. The structure of a chopper stabilized amplifier in accordance with the first preferred embodiment will now be described using FIG. 1. FIG. 1 is a circuit diagram illustrating a structure of a chopper stabilized amplifier in accordance with the first preferred embodiment of the present invention. In FIG. 1, units that are the same as in the conventional chopper stabilized amplifier CHOP_AMP shown in FIG. 10 are given the same descriptive symbols and a description thereof is omitted.

A chopper stabilized amplifier CHOP_AMP 1 shown in FIG. 1 differs from a conventional chopper stabilized amplifier in that a modulation/demodulation signal generation unit MOD_DEM is provided that supplies modulation signals CK1 and modulation signals nCK1 to a modulation circuit MOD, and supplies demodulation signals CK2 and demodulation signals nCK2 to a demodulation circuit DEMOD.

Figure 2:
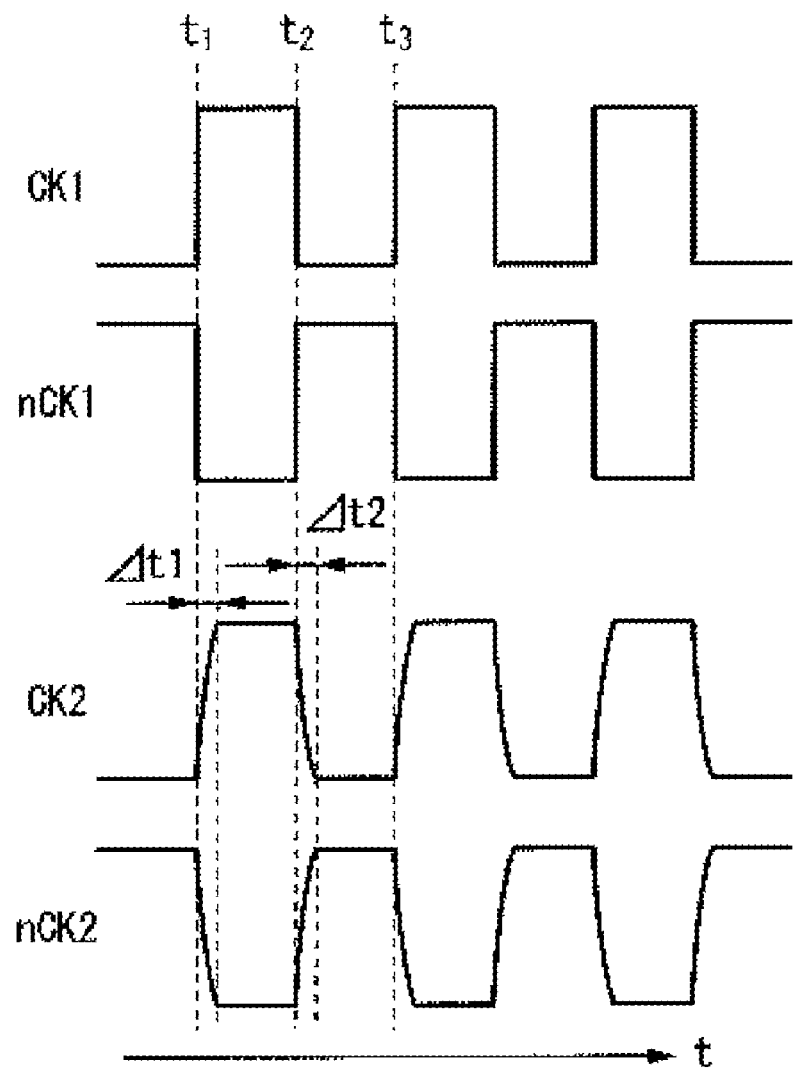
FIG. 2 is a timing chart illustrating waveforms of modulation signals and demodulation signals of the chopper stabilized amplifier in accordance with a first preferred embodiment of the present invention.

Hereinafter, the modulation signal CK1, the modulation signal nCK1, the demodulation signal CK2, and the demodulation signal nCK2 will be described using FIG. 2. FIG. 2 is a timing chart illustrating waveforms of the modulation signal CK1, the modulation signal nCK1, the demodulation signal CK2, and the demodulation signal nCK2. The modulation signal CK1 and the demodulation signal CK2 will now be described.

Switching of the logic level begins at substantially the same timings in the modulation signal CK1 and the demodulation signal CK2. The modulation signal CK1 is switched from "L" to "H" immediately after the switching of the logic level has begun at the timing t1. In contrast, the logic level of the demodulation signal CK2 becomes stable in an "H" state after a length of time Δt1 has elapsed after the start of the switching of the logic level at the timing t1. Note that because the operations of the modulation signal nCK1 and the demodulation signal nCK2 are simply the opposite of the logic levels of the modulation signal CK1 and the demodulation signal CK2, they are not described here.

As can be understood from FIG. 2, while the non-deviated rectangular wave-shaped modulation signals CK1 and nCK1 are input into the modulation circuit MOD, the deviated demodulation signals CK2 and nCK2 whose waveforms correspond to the differences between the frequency components of the first modulated signal Vmod1 and the second modulated signal Vmod2 are input into the demodulation circuit DEMOD. This is different from the case of a conventional chopper stabilized amplifier.

Figure 3:
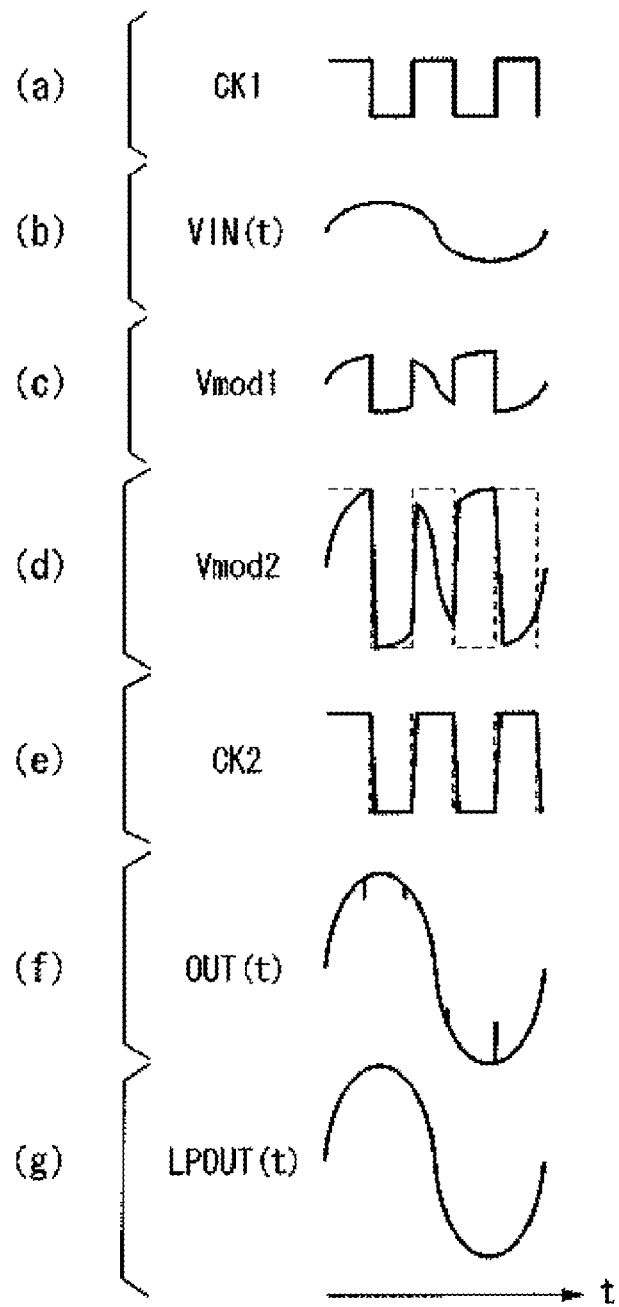
FIG. 3 is a timing chart illustrating a voltage signal at each node of the chopper stabilized amplifier in accordance with a first preferred embodiment of the present invention.

Hereinafter, the reason why using the chopper stabilized amplifier CHOP_AMP 1 of the first preferred embodiment makes it possible to amplify the input signal while reducing the occurrence of glitching compared to conventional example will be described using FIG. 3. FIG. 3 is a timing chart illustrating the voltage signal at each node of the chopper stabilized amplifier CHOP_AMP 1. In order to simplify the description, the voltages at each node shown in FIG. 3 are displayed with only one channel (for example, a system connected in the following sequence: the input terminal INP—the non-inverting input terminal of the operational amplifier circuit AMP—the non-inverting output terminal of the operational amplifier circuit AMP—the output terminal OUTP) of the operational amplifier circuit AMP, which is a fully differential amplifier, being used as representative thereof. The other channels may be thought of as channels in which the signal of the channel being displayed as representative is vertically inverted.

Figure 13:
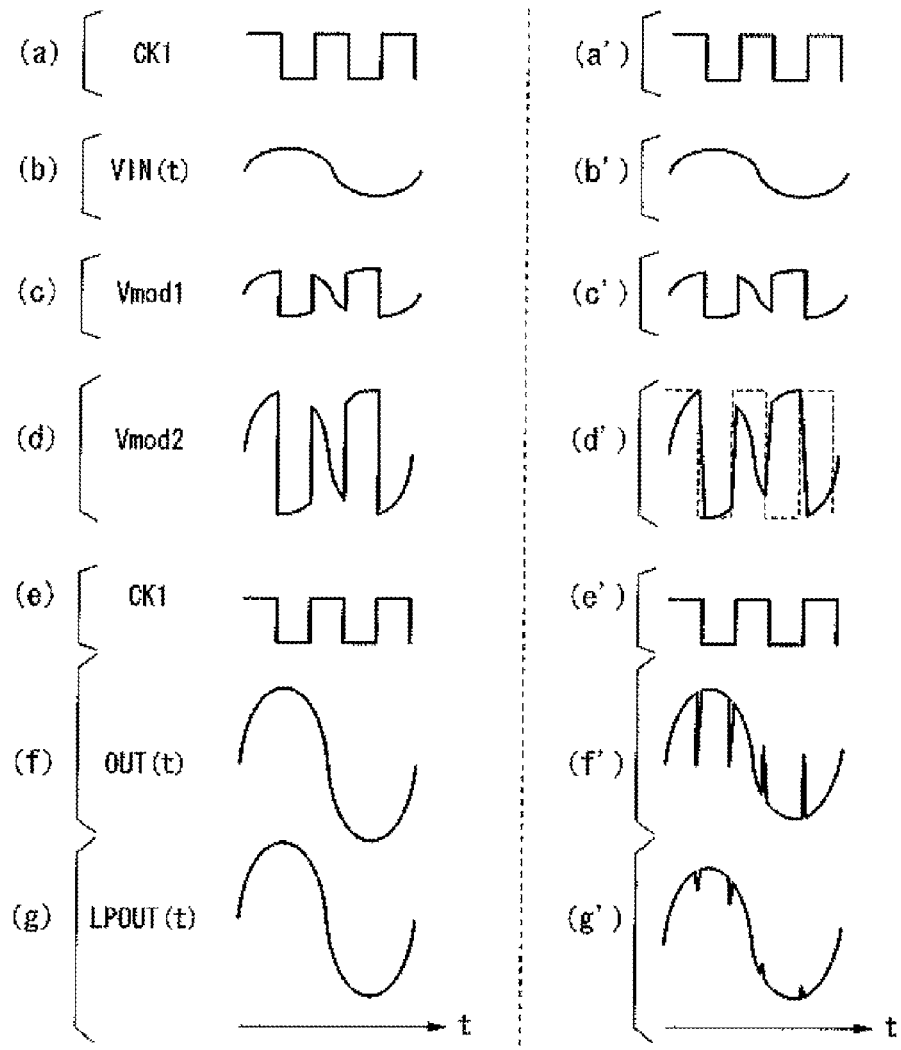
FIG. 13 is a timing chart illustrating a voltage signal at each node of the chopper stabilized amplifier in accordance with the related art.

Moreover, because the waveform (a) of FIG. 3 and the waveform (a) of FIG. 13, the waveform (b) of FIG. 3 and the waveform (b) of FIG. 13, the waveform (c) of FIG. 3 and the waveform (c) of FIG. 13, and the waveform (d) of FIG. 3 and the waveform (d) of FIG. 13 are the same, descriptions of the waveforms (a), (b), (c), and (d) of FIG. 3 are omitted.

The waveform (e) of FIG. 3 shows the waveform of the demodulation signal CK2 that is input into the demodulation circuit DEMOD. This signal differs from the modulation signal CK1 in that it has a slight deviation in its waveform. As has already been described, the second modulated signal Vmod2 described in the waveform (d) of FIG. 3 has a slightly deviated waveform. Accordingly, if the extent of the deviation occurring in the demodulation signal CK2 is approximately the same as the extent of the deviation occurring in the second modulated signal Vmod2, then glitching can be suppressed to such an extent that it can essentially be disregarded. The output signal OUT(t) obtained in this manner is shown in the waveform (f) of FIG. 3.

Note that, although not described in FIG. 1, a signal that has passed through a low-pass filter which is provided on the output side in order to remove input referred noise that has been modulated to a signal whose frequency is an odd multiple of the frequency of the demodulation signal CK2 and the demodulation signal nCK2 is shown in the waveform (g) of FIG. 3. As can be understood from the drawing, harmonic distortion which is a problem in a conventional chopper stabilized amplifier is substantially eliminated.

As has been described above, by using the chopper stabilized amplifier CHOP_AMP 1 of the first preferred embodiment, it is possible to suppress glitching that is generated in an output signal because the operational amplifier circuit has limited frequency characteristics and a limited slew rate, and it is possible to obtain an output signal having less harmonic distortion than is the case conventionally.

Second Preferred Embodiment

Figure 4:
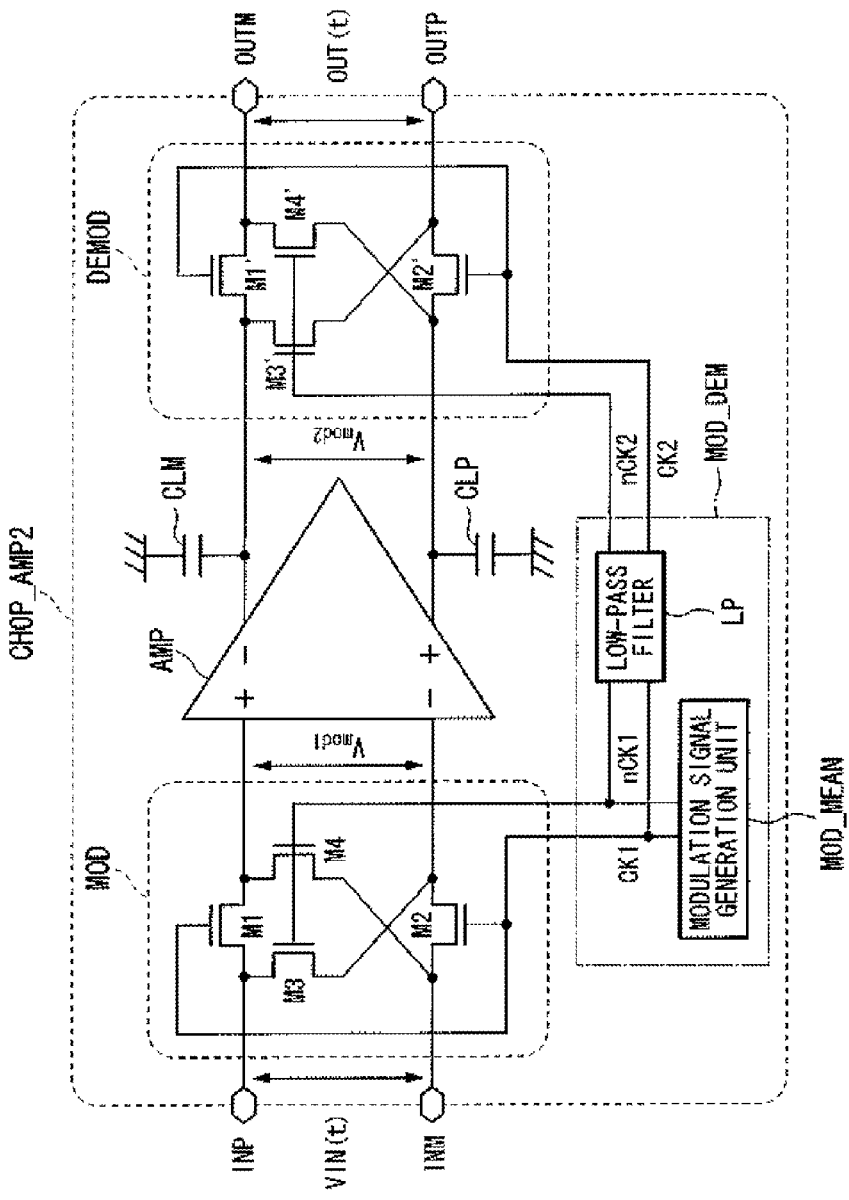
FIG. 4 is a circuit diagram illustrating a structure of the chopper stabilized amplifier in accordance with a second preferred embodiment of the present invention.

Next, a second preferred embodiment of the present invention will be described. The structure of a chopper stabilized amplifier in accordance with the second preferred embodiment will now be described using FIG. 4. FIG. 4 is a circuit diagram illustrating the structure of a chopper stabilized amplifier in accordance with the second preferred embodiment of the present invention. In FIG. 4, units that are the same as in the chopper stabilized amplifier CHOP_AMP 1 in accordance with the first preferred embodiment which is shown in FIG. 1 are given the same descriptive symbols and a description thereof is omitted.

A chopper stabilized amplifier CHOP_AMP 2 shown in FIG. 4 differs from the chopper stabilized amplifier CHOP_AMP 1 of the first preferred embodiment in that the switch units S1 to S4 and the switch units S1' to S4' are replaced specifically with the respective NMOS transistors M1 to M4 and the NMOS transistors M1' to M4', and in that the internal structure of the modulation/demodulation signal generation unit MOD_DEM is specifically described.

The modulation/demodulation signal generation unit MOD_DEM includes a modulation signal generation unit MOD_MEAN which generates the modulation signal CK1 and the modulation signal nCK1, and a low-pass filter LP which receives inputs of the modulation signal CK1 and the modulation signal nCK1 and which outputs the demodulation signal CK2 and the demodulation signal nCK2. The operational amplifier circuit AMP, the load capacitor CLP, and the load capacitor CLM which form part of the chopper stabilized amplifier CHOP_AMP 2 form a type of low-pass filter, the cutoff frequency thereof is provided by fc. Accordingly, by setting the value of the cutoff frequency of the low pass filter LP such that this is also fc, the extent of the deviation generated in the second modulated signal Vmod2 and the extent of the deviation generated in the demodulation signal CK2 and the demodulation signal nCK2 can be made substantially the same.

As has been described above, by using the chopper stabilized amplifier CHOP_AMP 2 of the second preferred embodiment, it is possible to suppress glitching that is generated in an output signal because the operational amplifier circuit has limited frequency characteristics and a limited slew rate, and it is possible to obtain an output signal having less harmonic distortion than is the case conventionally. In addition, by using the chopper stabilized amplifier CHOP_AMP 2 of the second preferred embodiment, it is possible to make the signal that provides a reference for the modulation signal CK1 and the demodulation signal CK2 a signal that is also common to the signal that provides a reference for the modulation signal nCK1 and the demodulation signal nCK2. As a result of this, it is possible to generate highly accurate modulation signals and demodulation signals. Namely, it is possible to effectively suppress any glitching generated in an output signal, and obtain an output signal that has less harmonic distortion than is the case conventionally.

Figure 5:
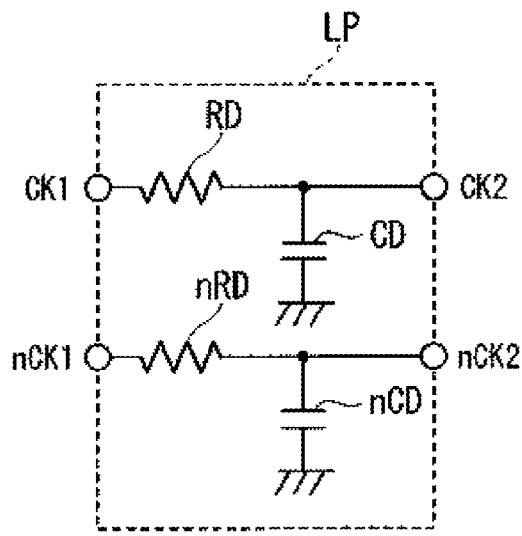
FIG. 5 is a circuit diagram illustrating a structure of a low-pass filter in the chopper stabilized amplifier in accordance with the second preferred embodiment of the present invention.

Hereinafter, the specific structure of the low-pass filter that forms part of the chopper stabilized amplifier CHOP_AMP 2 in accordance with the second preferred embodiment will be described using to FIG. 5. FIG. 5 is a circuit diagram illustrating the specific structure of the low-pass filter LP. The low-pass filter LP includes a resistor RD, a capacitor CD, a resistor nRD, and a capacitor nCD.

A first terminal of the resistor RD is connected to the wiring of the modulation signal CK1, and a second terminal of the resistor RD is connected to the wiring of the demodulation signal CK2. A first terminal of the capacitor CD is connected to the second terminal of the resistor RD, and a second terminal of the capacitor CD is connected to the ground. A first terminal of the resistor nRD is connected to the wiring of the modulation signal nCK1, and a second terminal of the resistor nRD is connected to the wiring of the demodulation signal nCK2. A first terminal of the capacitor CD is connected to the second terminal of the resistor nRD, and a second terminal of the capacitor CD is connected to the ground.

The product of the resistance value Rd of the resistor RD and the capacity value Cd of the capacitor CD is set such that it substantially matches the product of a transconductance gm of the operational amplifier circuit AMP and the load capacitor CLP or the load capacitor CLM of the operational amplifier circuit AMP. Moreover, the product of the resistance value nRd of the resistor nRD and the capacity value nCd of the capacitor nCD is set such that it substantially matches the product of an inverse 1/gm of the transconductance of the operational amplifier circuit AMP and the load capacitor CLP or the load capacitor CLM of the operational amplifier circuit AMP.

As has already been described, although the operational amplifier circuit AMP has limited frequency characteristics, when the operational amplifier AMP is a transconductance amplifier, the cutoff frequency fc1 thereof is provided by the following Formula (1).

$$f_{c1} = \frac{g_m}{2\pi C_{CLP}} \qquad (1)$$

Namely, in the operational amplifier circuit AMP, components having a higher frequency than the cutoff frequency fc1 become attenuated by the low-pass characteristics of the amplifier, and this becomes a cause of the deviation in the second modulated signal Vmod2. In contrast, the resistor RD and the capacitor CD form a low pass filter whose cutoff frequency fc2 is expressed by the following Formula (2).

$$f_{c2} = \frac{1}{2\pi R d C d} \qquad (2)$$

As has already been described, because the product of the resistance value Rd of the resistor RD and the capacity value Cd of the capacitor CD is set such that it substantially matches the product of an inverse 1/gm of the transconductance of the operational amplifier circuit AMP and the load capacitor CLP or the load capacitor CLM of the operational amplifier circuit AMP, a relationship whereby fc1=fc2 is established. Accordingly, in a high-frequency signal that forms part of the modulation signal CK1, components on the high-frequency side of the cutoff frequency fc1 are attenuated, and a deviation is generated in the waveform. Here, because fc1=fc2, the extent of the deviation generated in the second modulated signal Vmod2 and the extent of the deviation generated in the demodulation signal CK2 and the demodulation signal nCK2 can be made substantially the same.

As is described above, by using the chopper stabilized amplifier CHOP_AMP 2 of the second preferred embodiment, it is possible to suppress glitching that is generated in an output signal because the operational amplifier circuit AMP has limited frequency characteristics and a limited slew rate, and, in particular, it is possible to more effectively suppress glitching that is generated in an output signal because the operational amplifier circuit AMP has limited frequency characteristics, and it is thereby possible to obtain an output signal having less harmonic distortion than is the case conventionally.

Third Preferred Embodiment

Figure 6:
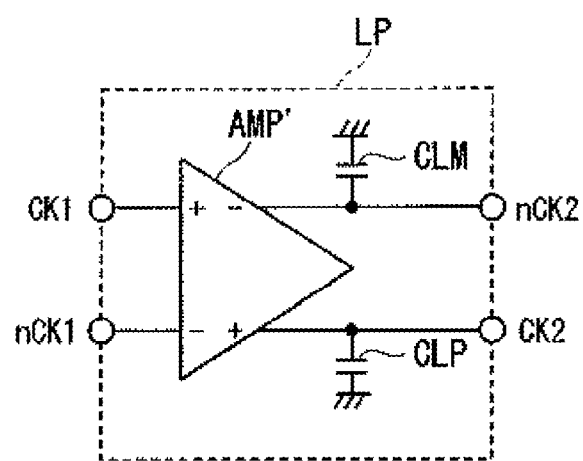
FIG. 6 is a circuit diagram illustrating a structure of a low-pass filter in the chopper stabilized amplifier in accordance with a third preferred embodiment of the present invention.

Next, a third preferred embodiment of the present invention will be described. The structure of a chopper stabilized amplifier according to the third preferred embodiment will now be described using FIG. 6. FIG. 6 is a circuit diagram illustrating the specific structure of a low-pass filter LP which forms part of the chopper stabilized amplifier CHOP_AMP 2 shown in FIG. 4.

The low-pass filter LP includes an operational amplifier circuit AMP' in which a non-inverting input terminal is connected to the wiring of the modulation signal CK1, an inverting input terminal is connected to the wiring of the modulation signal nCK1, an inverting output terminal is connected to the wiring of the demodulation signal nCK2, and a non-inverting output terminal is connected to the wiring of the modulation circuit CK2.

The characteristics of the operational amplifier circuit AMP' which is used as a low-pass filter are desirably the same as the characteristics of the operational amplifier circuit AMP. By doing this, the extent of the deviation in the second modulated signal Vmod2 which is generated because the operational amplifier circuit AMP has limited frequency characteristics and a limited slew rate and the extent of the deviation generated in the demodulation signal CK2 can be made substantially the same.

As is described above, by using the chopper stabilized amplifier CHOP_AMP 2 of the third preferred embodiment, it is possible to suppress glitching that is generated in an output signal because the operational amplifier circuit AMP has limited frequency characteristics and a limited slew rate, and it is possible to obtain an output signal having less harmonic distortion than is the case conventionally.

Fourth Preferred Embodiment

Figure 7:
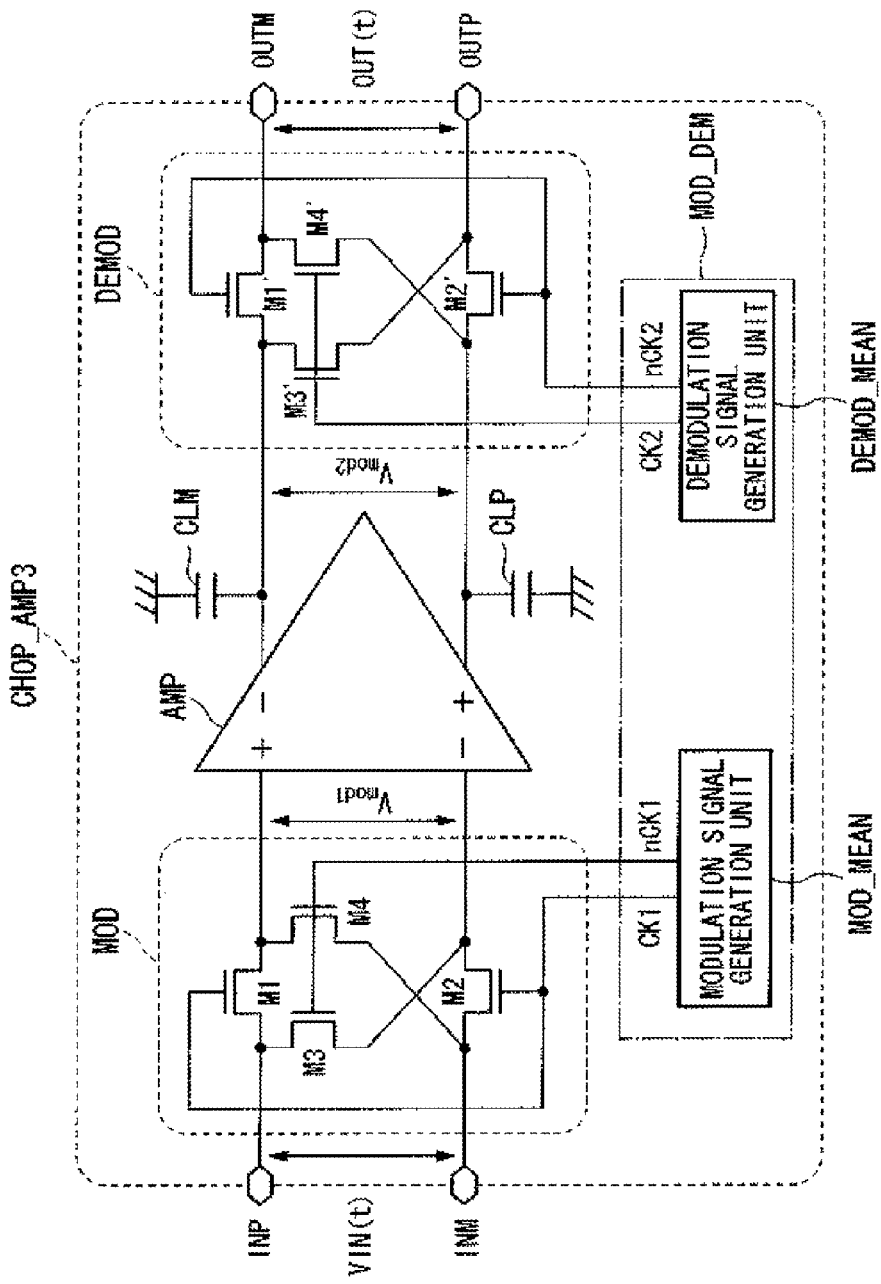
FIG. 7 is a circuit diagram illustrating a structure of the chopper stabilized amplifier in accordance with a fourth preferred embodiment of the present invention.

Next, a fourth preferred embodiment of the present invention will be described. The structure of a chopper stabilized amplifier according to the fourth preferred embodiment will now be described using FIG. 7. FIG. 7 is a circuit diagram illustrating the structure of a chopper stabilized amplifier in accordance with the fourth preferred embodiment of the present invention. In FIG. 7, units that are the same as in the chopper stabilized amplifier CHOP_AMP 2 according to the second preferred embodiment which is shown in FIG. 4 are given the same descriptive symbols and a description thereof is omitted.

A chopper stabilized amplifier CHOP_AMP 3 shown in FIG. 7 differs from the chopper stabilized amplifier CHOP_AMP 2 of the second preferred embodiment in the internal circuit structure of the modulation/demodulation signal generation unit MOD_DEM. The modulation/demodulation signal generation unit MOD_DEM includes the modulation signal generation unit MOD_MEAN which outputs the modulation signal CK1 and the modulation signal nCK1, and a demodulation signal generation unit DEMOD_MEAN which outputs the demodulation signal CK2 and the demodulation signal nCK2.

In the fourth preferred embodiment as well, the modulation signal generation unit MOD_MEAN generates the modulation signals CK1 and the modulation signals nCK1 that are rectangular waves having a predetermined frequency, and the demodulation signal generation unit DEMOD_MEAN generates the demodulation signals CK2 and nCK2 whose waveforms correspond to the differences between the frequency components of the second modulated signal Vmod2 and the first modulated signal Vmod1.

Operations of the chopper stabilized amplifier CHOP_AMP 3 are the same as the operations of the chopper stabilized amplifier CHOP_AMP 1 according to the first preferred embodiment. Accordingly, by using the chopper stabilized amplifier CHOP_AMP 3, it is possible to suppress glitching that is generated in an output signal because the operational amplifier circuit has limited frequency characteristics and a limited slew rate, and it is possible to obtain an output signal having less harmonic distortion than is the case conventionally.

Figure 8:
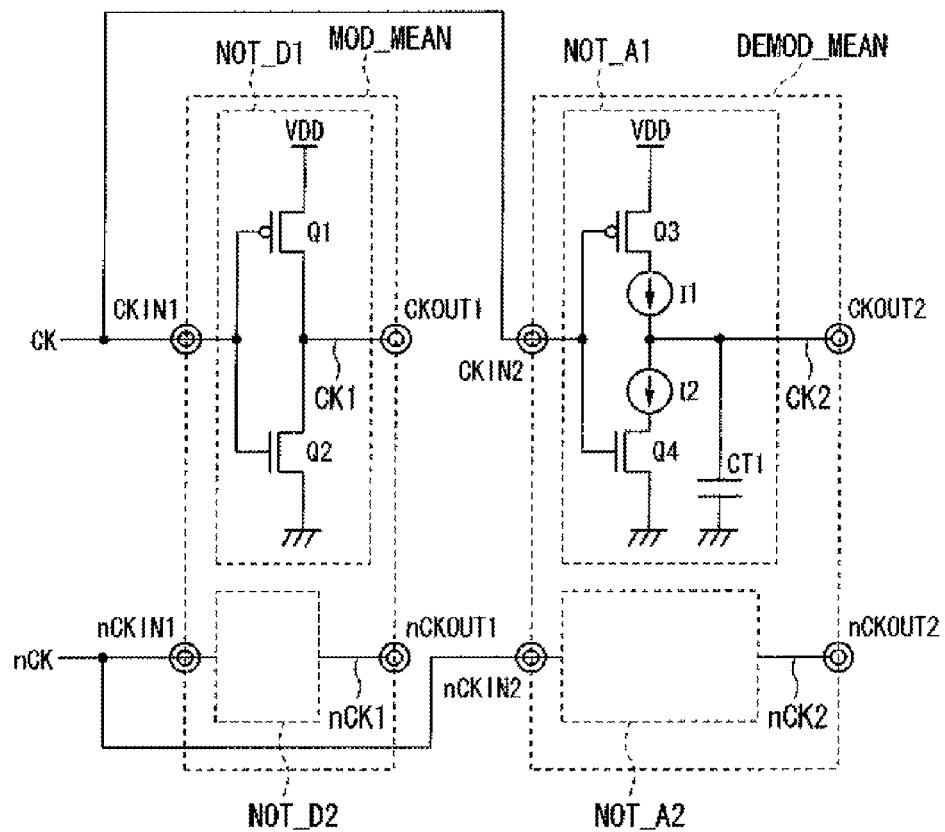
FIG. 8 is a circuit diagram illustrating a structure of the modulation signal generation unit and the demodulation signal generation unit in the chopper stabilized amplifier in accordance with the fourth preferred embodiment of the present invention.

The specific circuit structures of the modulation signal generation unit MOD_MEAN and the demodulation signal generation unit DEMOD_MEAN that form part of the chopper stabilized amplifier CHOP_AMP 3 will now be described using FIG. 8. FIG. 8 is a circuit diagram illustrating the specific circuit structure of the modulation signal generation unit MOD_MEAN and the demodulation signal generation unit DEMOD_MEAN.

The modulation signal generation unit MOD_MEAN includes a NOT circuit NOT_D1 that inverts a rectangular wave CK which is input via an input terminal CKIN1 and then outputs the modulation signal CK1 via an output terminal CKOUT1, and a NOT circuit NOT_D2 that inverts a rectangular wave nCK which is input via an input terminal nCKIN1 and then outputs the modulation signal nCK1 via an output terminal nCKOUT1.

The source of the rectangular wave CK and the rectangular wave nCK is not shown in the drawing, however, they may be supplied from a rectangular wave generation circuit which is packaged inside the same chip as the chopper stabilized amplifier CHOP_AMP 3, or they may be supplied from a rectangular wave generation device located outside the chip.

The NOT circuit NOT_D1 includes a PMOS transistor Q1 whose source is connected to a power supply terminal, whose gate is connected to the input terminal CKIN1, and whose drain is connected to the output terminal CKOUT1, and an NMOS transistor Q2 whose source is connected to a ground, whose gate is connected to the input terminal CKIN1, and whose drain is connected to the output terminal CKOUT1. Note that because the structure of the NOT circuit NOT_D2 is the same as the structure of the NOT circuit NOT_D1 no description thereof is given here.

Operations of the NOT circuit NOT_D1 will now be described. When an "H" signal is input via the input terminal CKIN1, the PMOS transistor Q1 is switched off, and the NMOS transistor Q2 is switched on. Accordingly, an "L" signal is output from the output terminal CKOUT1. Moreover, when an "L" signal is input via the input terminal CKIN1, the PMOS transistor Q1 is switched on, and the NMOS transistor Q2 is switched off. Accordingly, an "H" signal is output from the output terminal CKOUT1. Note that because the operation of the NOT circuit NOT_D2 is the same as the operation of the NOT circuit NOT_D1 no description thereof is given here.

Next, the demodulation signal generation unit DEMOD_MEAN will be described. The demodulation signal generation unit DEMOD_MEAN includes a NOT circuit NOT_A1 that inverts a rectangular wave CK which is input via an input terminal CKIN2 and then outputs the modulation signal CK2 via an output terminal CKOUT2, and a NOT circuit NOT_A2 that inverts a rectangular wave nCK which is input via an input terminal nCKIN2 and then outputs the modulation signal nCK2 via an output terminal nCKOUT2.

The analog NOT circuit NOT_A1 includes a PMOS transistor Q3 whose source is connected to a power supply terminal and whose gate is connected to the input terminal CKIN2, a current source I1 whose first terminal is connected to the drain terminal of the PMOS transistor Q3 and whose second terminal is connected to the output terminal CKOUT2, an NMOS transistor Q4 whose source is connected to the ground and whose gate is connected to the input terminal CKIN2, a current source 12 whose first terminal is connected to the output terminal CKOUT2 and whose second terminal is connected to the drain terminal of the NMOS transistor Q4, and a load capacitor CT1 whose first terminal is connected to the output terminal CKOUT2 and whose second terminal is connected to the ground. Note that because the circuit structure of a NOT circuit NOT_A2 is the same as the circuit structure of the NOT circuit NOT_A1, a detailed description thereof has been omitted.

If the rise slew rate of the operational amplifier circuit AMP is taken as SR+, then it is desirable for the values of the current Cu1 flowing from the current source I1 and of the capacity Ct1 of the load capacitor CT1 to be set as in the following Formula (3).

$$SR+ = Cu1/Ct1 \qquad (3)$$

Moreover, if the fall slew rate of the operational amplifier circuit AMP is taken as SR−, then it is desirable for the values of the current Cu2 flowing into the current source I2 and of the capacity Ct1 of the load capacitor CT1 to be set as in the following Formula (4).

$$SR- = Cu2/Ct1 \qquad (4)$$

By setting the values of Cu1, Cu2, and CT1 in this manner, the extent of the deviation in the modulated signal Vmod2 which is generated because the operational amplifier circuit AMP has a limited slew rate and the extent of the deviation generated in the demodulation signal CK2 can be made substantially the same.

As is described above, by using the chopper stabilized amplifier CHOP_AMP 3 of the fourth preferred embodiment, it is possible to suppress glitching that is generated in an output signal because the operational amplifier circuit AMP has limited frequency characteristics and a limited slew rate, and, in particular, it is possible to more effectively suppress glitching that is generated in an output signal because the operational amplifier circuit AMP has a limited slew rate, and it is thereby possible to obtain an output signal having less harmonic distortion than is the case conventionally.

Fifth Preferred Embodiment

Figure 9:
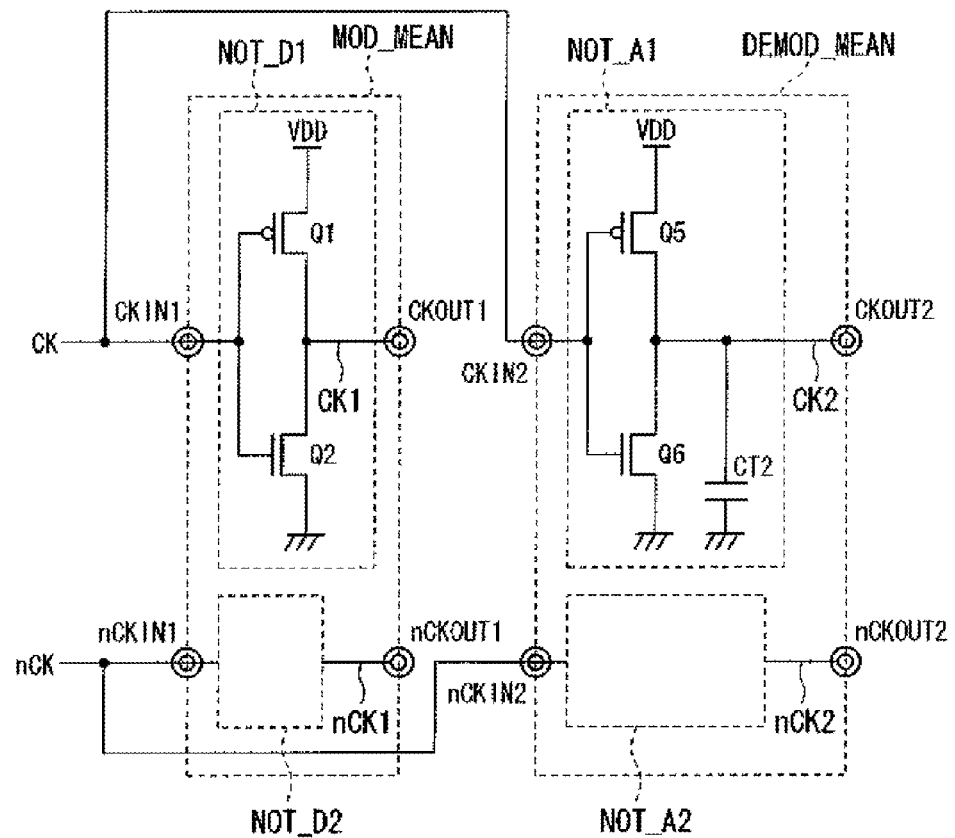
FIG. 9 is a circuit diagram illustrating a structure of the modulation signal generation unit and the demodulation signal generation unit in the chopper stabilized amplifier in accordance with a fifth preferred embodiment of the present invention.

Next, a fifth preferred embodiment of the present invention will be described. The structure of a chopper stabilized amplifier according to the fifth preferred embodiment will now be described using FIG. 9. FIG. 9 is a circuit diagram illustrating the specific structure of the modulation signal generation unit MOD_MEAN and the demodulation signal generation unit DEMOD_MEAN that form the chopper stabilized amplifier CHOP_AMP 3 shown in FIG. 7. Because the structure of the modulation signal generation unit MOD_MEAN of the fifth preferred embodiment is the same as the structure of the modulation signal generation unit MOD_MEAN shown in FIG. 8, the same descriptive symbols are used and a detailed description thereof has been omitted.

The demodulation signal generation unit DEMOD_MEAN will now be described. The demodulation signal generation unit DEMOD_MEAN includes an analog NOT circuit NOT_A1 that inverts a rectangular wave CK which is input via the input terminal CKIN2 and then outputs the modulation signal CK2 via the output terminal CKOUT2, and a NOT circuit NOT_A2 that inverts the rectangular wave nCK which is input via the input terminal nCKIN2 and then outputs the modulation signal nCK2 via the output terminal nCKOUT2.

The source of the rectangular wave CK and the rectangular wave nCK is not shown in the drawing, however, they may be supplied from a rectangular wave generation circuit which is packaged inside the same chip as the chopper stabilized amplifier CHOP_AMP 3, or they may be supplied from a rectangular wave generation device located outside the chip. Note that because the circuit structure and operation of the analog NOT circuit NOT_A2 is the same as the circuit structure and operation of the analog NOT circuit NOT_A1, only the analog NOT circuit NOT_A1 is described here.

The NOT circuit NOT_A1 includes a PMOS transistor Q5 whose source is connected to a power supply terminal, whose gate is connected to the input terminal CKIN2, and whose drain is connected to the output terminal CKOUT2, an NMOS transistor Q6 whose source is connected to a ground, whose gate is connected to the input terminal CKIN2, and whose drain is connected to the output terminal CKOUT2, and the load capacitor CT2 whose first terminal is connected to the output terminal CKOUT2 and whose second terminal is connected to the ground.

Because the analog NOT circuit NOT_A1 is constructed by adding the load capacitor CT2 to the output terminal of the NOT circuit NOT_D1, the output signal response after a sufficiently prolonged time has elapsed after the logic level of the input signal has been established is the same as in the NOT circuit NOT_D1. However, as a result of the load capacitor CT2 being added to the output terminal, the response characteristics immediately after the logic level of the input signal has been established are different from those of the NOT circuit NOT_D1, therefore, this point will now be described in detail.

When the logic level of the rectangular wave CK is "L", the PMOS transistor Q5 is switched on and the demodulation signal CK2 attempts to change to "H". However, because the PMOS transistor Q5 has the limited On resistor RONQ5, the control signal which is output has the same waveform as the ideal rectangular wave that has passed through the low-pass filter having the cutoff frequency fc3 which is expressed by the following Formula (5).

$$f_{c3} = \frac{1}{2\pi R_{ONQ5} Ct2} \qquad (5)$$

When the logic level of the rectangular wave CK is "H", the NMOS transistor Q6 is switched on and the demodulation signal CK2 attempts to change to "L". However, because the NMOS transistor Q6 has the limited On resistor RONQ6, the control signal which is output has the same waveform as the ideal rectangular wave that has passed through the low-pass filter having the cutoff frequency fc4 which is expressed by the following Formula (6).

$$f_{c4} = \frac{1}{2\pi R_{ONQ6} Ct2} \qquad (6)$$

The On-resistance Ron of the MOS transistors is provided by the following Formula (7). In this formula, μ is the mobility of the carrier, Cox is the thickness of the gate oxide film, W is the gate width, L is the gate length, VGS is the voltage between the gate and the drain, and VTH is the threshold voltage of the transistor.

$$R_{on} = \frac{1}{\mu C_{ox} \frac{W}{L}(V_{GS} - V_{TH})} \quad (7)$$

From Formula (7) it is possible to suitably adjust the extent of deviation in the demodulation signal CK2 by selecting an appropriate capacity value Ct2 and W/L ratio for the transistor. Accordingly, the extent of the deviation in the modulated signal Vmod2 which is generated because the operational amplifier circuit AMP has a limited slew rate and the extent of the deviation generated in the demodulation signal CK2 can be made substantially the same.

Note that, although not shown in the drawings, it is possible to obtain the same effects by forming divisions between the drain terminal of the PMOS transistor Q5, the drain terminal of the NMOS transistor Q6, the first terminal of the load capacitor CT2, and the point where the wiring of the demodulation signal CK2 is connected and cutting them such that they are separated between the node where the drain terminal of the PMOS transistor Q5 and the drain terminal of the NMOS transistor Q6 are connected, the first terminal of the load capacitor CT2, and the point where the wiring of the demodulation signal CK2 is connected, and then inserting resistors in each division.

As has been described above, by using the chopper stabilized amplifier CHOP_AMP 3 according to the fifth preferred embodiment, it is possible to suppress glitching that is generated in an output signal because the operational amplifier circuit AMP has limited frequency characteristics and a limited slew rate, and, in particular, it is possible to more effectively suppress glitching that is generated in an output signal because the operational amplifier circuit AMP has a limited slew rate, and it is thereby possible to obtain an output signal having less harmonic distortion than is the case conventionally.

While preferred embodiments of the present invention have been described and illustrated above, it should be understood that these are exemplary of the invention and are not to be considered as limiting. Additions, omissions, substitutions, and other modifications can be made without departing from the scope of the present invention. For example, the respective switch units that make up the modulation circuit MOD and the demodulation circuit DEMOD are NMOS transistors in the above description, however, they may also be PMOS transistors or another type of analog switch. Accordingly, the invention is not to be considered as being limited by the foregoing description, and is only limited by the scope of the claims.

What is claimed is:

1. A chopper stabilized amplifier comprising:
   a modulation circuit that performs a digital conversion on an input signal so as to convert the input signal into a first modulated signal by using a modulation signal, the modulation signal being a rectangular wave having a predetermined frequency;
   an operational amplifier circuit that amplifies the first modulated signal so as to convert the first modulated signal into a second modulated signal; and
   a demodulation circuit that performs analog conversion on the second modulated signal so as to convert the second modulated signal into an output signal by using a demodulation signal, the demodulation signal having a waveform that corresponds to the differences between frequency components of the first modulated signal and the second modulated signal.

2. The chopper stabilized amplifier according to claim 1, further comprising:
   a modulation/demodulation signal generation unit that is connected to the modulation circuit and the demodulation circuit, the modulation/demodulation signal generation unit supplying the modulation signal to the modulation circuit, the modulation/demodulation signal generation unit supplying the demodulation signal generated based on the modulation signal to the demodulation circuit.

3. The chopper stabilized amplifier according to claim 2, wherein the modulation/demodulation signal generation unit comprises:
   a modulation signal generation unit that outputs a rectangular wave as the modulation signal; and
   a low-pass filter that receives the rectangular waves so as to output as the demodulation signal a signal in which only high frequency components of the rectangular wave have been attenuated.

4. The chopper stabilized amplifier according to claim 3, wherein cutoff frequency of the low-pass filter substantially matches cutoff frequency of the operational amplifier circuit.

5. The chopper stabilized amplifier according to claim 4, wherein the low-pass filter comprises a resistor and a capacitor.

6. The chopper stabilized amplifier according to claim 4, wherein the low-pass filter comprises a second operational amplifier circuit whose characteristics are the same as characteristics of the operational amplifier circuit.

7. The chopper stabilized amplifier according to claim 2, wherein the modulation/demodulation signal generation unit comprises:
   a modulation signal generation unit that outputs a rectangular wave as the modulation signal; and
   a demodulation signal generation unit that outputs as the demodulation signal a signal in which only high frequency components of the rectangular wave have been attenuated.

8. The chopper stabilized amplifier according to claim 7, wherein the modulation signal generation unit is a NOT circuit, and the demodulation signal generation unit is a NOT circuit having a current setting function.

9. The chopper stabilized amplifier according to claim 7, wherein the modulation signal generation unit is a NOT circuit, and the demodulation signal generation unit is a NOT circuit having a larger load capacitor than the modulation signal generation unit.

* * * * *